United States Patent [19]

Elabd et al.

[11] Patent Number: 4,638,345
[45] Date of Patent: Jan. 20, 1987

[54] IR IMAGING ARRAY AND METHOD OF MAKING SAME

[75] Inventors: Hammam Elabd, East Windsor; Walter F. Kosonocky, Skillman, both of N.J.

[73] Assignee: RCA Corporation, Princeton, N.J.

[21] Appl. No.: 500,187

[22] Filed: Jun. 1, 1983

[51] Int. Cl.[4] ............................................. H01L 29/78
[52] U.S. Cl. ....................................... 357/24; 357/15; 357/30; 357/52
[58] Field of Search ................. 357/24 LR, 15, 30, 52

[56] References Cited

U.S. PATENT DOCUMENTS

| | | | |
|---|---|---|---|
| 4,040,076 | 8/1977 | Kosonocky et al. | 357/15 |
| 4,063,964 | 12/1977 | Peressini et al. | 148/1.5 |
| 4,089,020 | 5/1978 | Ikeda et al. | 357/15 |
| 4,119,446 | 10/1978 | Mastroianni | 148/1.5 |
| 4,261,095 | 4/1981 | Dreves et al. | 29/571 |
| 4,533,933 | 8/1985 | Pellegrini et al. | 357/15 |

FOREIGN PATENT DOCUMENTS

| | | | |
|---|---|---|---|
| 58-157177A | 9/1983 | Japan | 357/30 A |
| 2103875A | 2/1983 | United Kingdom | 357/24 LR |

OTHER PUBLICATIONS

"Design and Performance of 64×128 Element PtSi Schottky-Barrier Infrared Charge-Coupled Device (IRCCD) Focal Plane Array" by W. F. Kosonocky et al., *SPIE Vol. 344, Infrared Sensor Technology,* (1982), pp. 66–77.

*Primary Examiner*—Martin H. Edlow
*Attorney, Agent, or Firm*—Birgit E. Morris; Donald S. Cohen

[57] ABSTRACT

An array of infra-red (IR) detectors for a CCD image sensor includes a plurality of spaced areas of a conductive material at the surface of a substrate of semiconductor material of one conductivity type with each conductive area forming a Schottky-barrier diode with the substrate to form the IR detectors. Each detector includes a high conductivity contact region within the substrate. Between the detector area is a guard band which consists of a region of a conductivity type opposite to that of the substrate within the substrate and around said detector area. The guard band is spaced from the contact regions and each conductive area overlaps a portion of its adjacent guard band.

7 Claims, 20 Drawing Figures

IR IMAGING ARRAY AND METHOD OF MAKING SAME

BACKGROUND

The present invention relates to an infrared (IR) imaging array which includes Schottky-barrier detectors, and more particularly to isolation means for the detectors for such an array which provides for a more compact array.

Schottky-barrier infrared (IR) charge coupled device (CCD) image sensors include a plurality of Schottky-barrier IR detectors arranged in a row for a line array or in rows and columns for an area array and coupled to a CCD which provides a read-out of the signals from the detectors. One type of Schottky-barrier IR detector includes a layer of either platinum silicide or palladium silicide on P−type conductivity single crystalline silicon with an N−type conductivity guard band surrounding the silicide layer. The guard ring serves to eliminate dark current spikes which could occur as a result of high field regions at the perimeter of the Schottky barrier. In order to isolate adjacent detectors from each other so as to prevent leakage and cross-talk between adjacent detectors, it has been the practice to provide P+ type conductivity channel stop between adjacent detectors.

The resolution of such an imaging device depends on the number of detectors in the array. The larger the number of detectors, the better the resolution. To achieve television-type resolution, it is necessary to have an array which is 512 detectors by 512 detectors. The larger the array, the larger the substrate that is required to make the device. In order to maintain the device as small as possible and thereby use a minimum size substrate, it is desirable to make the detector array as compact as possible. Another factor which has been a limitation in the development of the IR-CCD image sensors is the fill factor. The fill factor is defined as the ratio of the active detector area to the total pixel (picture element) area. Heretofore, the fill factor has been relatively low. One of the features of the detector array which affects its size is the isolation means between the detectors, i.e. the guard ring and channel stop. For example, the isolation means generally takes up about 20 micrometers of silicon real estate around each detector, which is about 42% of the length of each detector active area which is about 48 micrometers. Therefore, it would be desirable to reduce the size of the isolation means so as to reduce the overall size of the array while still maintaining the necessary isolation between the detectors of the array.

SUMMARY OF THE INVENTION

An array of infrared detectors includes a substrate of single crystalline silicon of one conductivity type having at one surface thereof a plurality of spaced apart areas of a conductive material with each of the conductive areas forming a Schottky-barrier junction with the substrate. Between adjacent conductive areas are means isolating the areas from each other. The isolating means consist of a region of a conductivity type opposite to that of the substrate which is in the substrate and extends along the one surface of the substrate between the areas. Each of the conductive areas contacts the isolation region.

DETAILED DESCRIPTION OF PREFERRED EMBODIMENT

Figure 1:
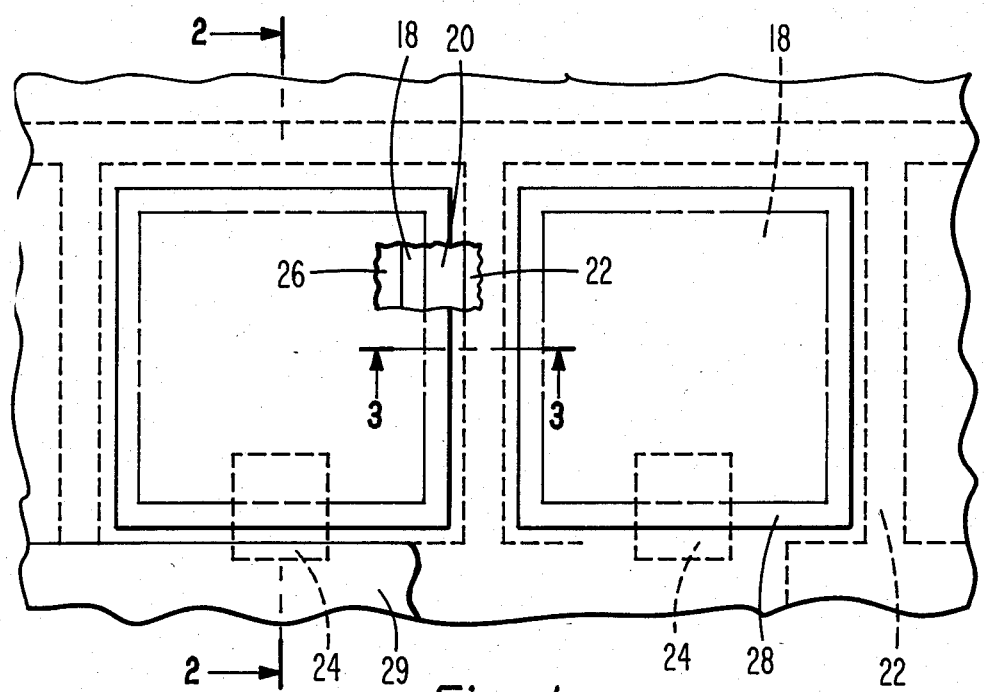
FIG. 1 is a top plane view of a portion of a Schottky-barrier infrared CCD image sensor made in accordance with the prior art.
Figure 2:
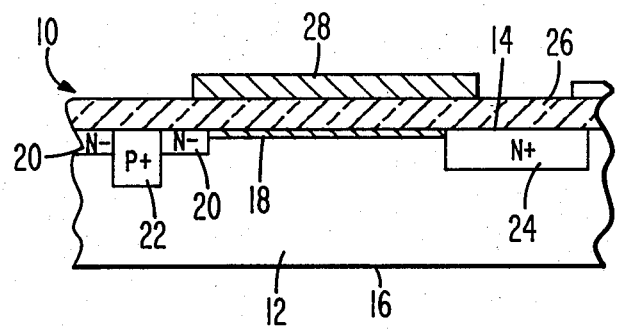
FIG. 2 is a sectional view taken along line 2—2 of FIG. 1.
Figure 3:
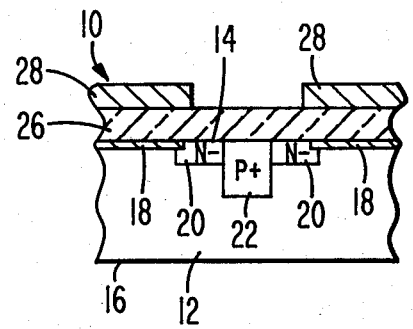
FIG. 3 is a sectional view taken along line 3—3 of FIG. 1.

Referring to FIGS. 1-3, an infrared detector array made in accordance with the prior art is generally designated as 10. The prior art IR detector array 10 includes a substrate 12 of a single crystalline material, such as silicon, of one conductivity type, such as P type, having opposed front and back surfaces 14 and 16, respectively. Along the front surface 14 of the substrate 12 are a plurality of spaced apart, rectangular detector areas 18 of a metal silicide such as platinum silicide. The detector areas 18 can be arranged in a row for a line array or in rows and columns for an area array. Around each of the detector areas 18 is a guard ring 20 of a conductivity type opposite to that of the substrate 12. The guard ring 20 contains a relatively low concentration of its conductivity modifier so as to be of relatively high resistance. Thus, for a substrate 12 of P type conductivity, the guard ring 20 is of N− type conductivity. Between the guard rings 20 and around the detector areas 18 is a channel stop 22. The channel stop 22 is of a conductivity type the same as that of the substrate 12 but of a higher carrier concentration so as to be of a lower resistivity. Thus, for a P type substrate 12, the channel stop 22 is of P+ type conductivity. Also, the channel stop 22 extends into the substrate 12 from the top surface 14 to a depth greater than the guard rings 20.

A coupling region 24 extends into the substrate 12 from the top surface 14 at one side of each of the detector areas 18 and serves to couple the detector area 18 to the CCD. The coupling region 24 is of a conductivity type opposite to that of the substrate 12 and has a high carrier concentration so as to be of a low resistance. Thus, the coupling region 24 is of N+ type conductivity. The top surface 14 of the substrate 12 is covered with a layer 26 of an insulating material, such as silicon dioxide. A radiation reflecting layer 28 is on the insulating layer 26 over each of the detector areas 18. The reflecting layer 28 is preferably of a metal which will reflect IR radiation, such as aluminum. Along the side of the detector array which has the coupling regions 24 is a transfer gate 29 of a CCD (not shown). The transfer gate 29 is of a conductive material, such as polycrystalline silicon. The transfer gate 29 may be a part of a CCD of any well known construction, such as that shown in the article of W. F. Kosonocky et al., entitled, "DESIGN AND PERFORMANCE OF 64×128 ELEMENT PtSi SCHOTTKY-BARRIER INFRARED CHARGE-COUPLED DEVICE (IRCCD) FOCAL PLANE ARRAY", published in SPIE, Volume 344, Infrared Sensor Technology (1982), pages 66-77. In the detector array 10, the guard ring 20 is typically of a width of about 7.5 micrometers and the channel stop 22 is typically of a width of about 5 micrometers so that the total spacing between adjacent detector areas 18 is about 20 micrometers.

Figure 4:
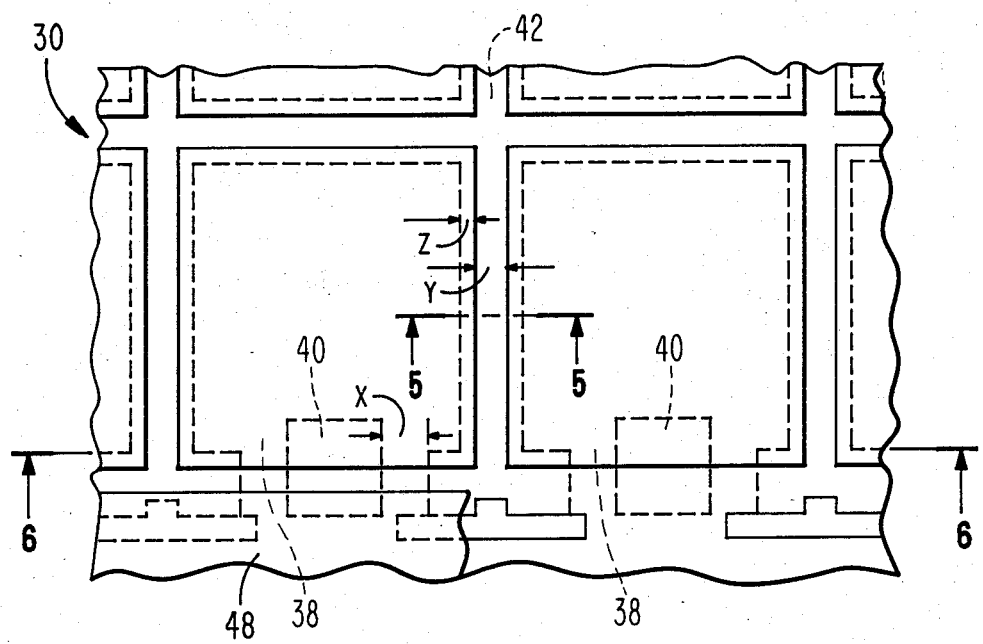
FIG. 4 is a top plane view of a portion of a Schottky-barrier infrared imaging array which incorporates the present invention.
Figure 5:
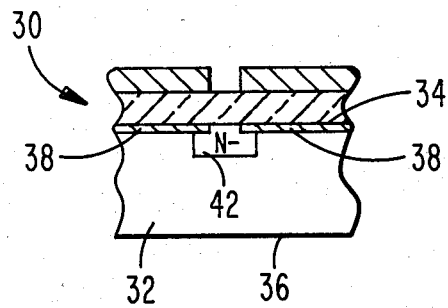
FIG. 5 is a sectional view taken along line 5—5 of FIG. 4.
Figure 6:
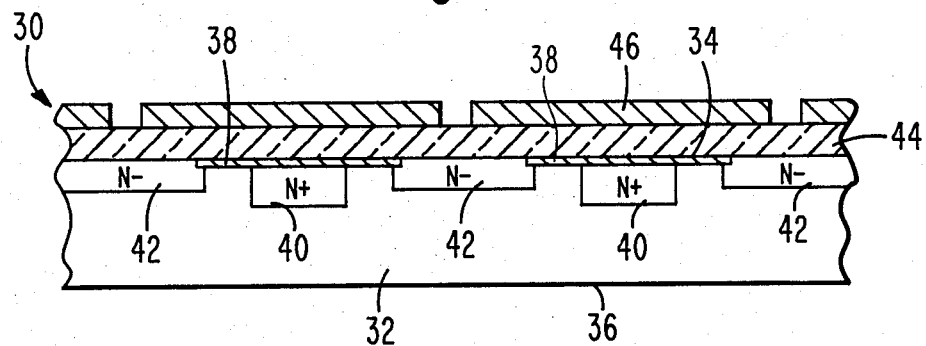
FIG. 6 is a sectional view taken along line 6—6 of FIG. 4.
Figure 7:
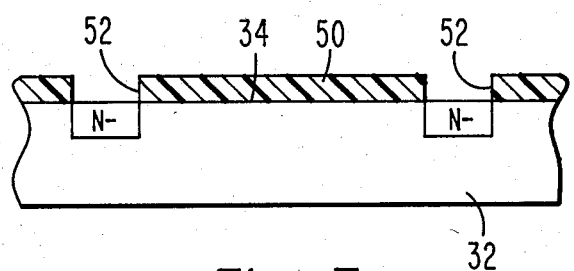
FIGS. 7-10 are sectional views illustrating the steps of one method for making the detector array of the present invention.

Referring to FIGS. 4-6, a detector array made in accordance with the present invention is generally designated as 30. The detector array 30 includes a substrate 32 of single crystalline semiconductor material, such as silicon, of one conductivity type, such as P type. The substrate 32 has opposed front and back surfaces 34 and 36 respectively. Along the front surface 34 of the substrate 32 are a plurality of spaced, rectangular detector areas 38 of a metal silicide, such as platinum silicide, which form Schottky-barrier junctions with the substrate 32. The detector areas 38 are arranged along the front surface 34 either in a row for a line array or in rows and columns for an area array. A coupling region 40 for each of the detector areas 38 is in the substrate 32 along one side of the detector area 38. Each coupling region 40 is of a conductivity type opposite to that of the substrate 32 and contains a high amount of conductivity modifiers so that it is of low resistance. Thus, each coupling region 40 is of N+ type conductivity for a substrate of P type conductivity. Between the detector areas 38 is a guard ring 42 of a conductivity type opposite to that of the substrate 32. The guard ring 42 contains a relatively low amount of conductivity modifier so as to be of relatively high resistance. Thus, the guard ring 42 is of N− type conductivity for a substrate of P type conductivity. As shown in FIG. 5, each of the sides of the detector areas 38 overlaps the guard ring 42 so as to be in contact with the guard ring 42. As shown in FIG. 4, the overlap Z between the detector areas 38 and the guard ring 42 is preferably about 1 to 2 micrometers and the distance Y between adjacent detector areas 38 is preferably about 2 to 5 micrometers. As shown in FIGS. 4 and 6, the guard ring 42 extends almost completely around each of the detector areas 38 but is spaced from the coupling region 40. The spacing X between the guard ring 42 and coupling region 40 is preferably about 5 to 7 micrometers.

The detector array 30, like the prior art detector 10, includes an insulating layer 44, such as of silicon dioxide, over the front surface 34 of the substrate 32. Metal reflecting layers 46 are on the insulating layer 44 over each of the detector areas 38. A transfer gate 48 of a conductive material, such as polycrystalline silicon, is on the insulating layer 44 and extends along the detector array to transfer the photocharge from the detector areas to a CCD (not shown) which is on the substrate 32 adjacent the array.

Figure 8:
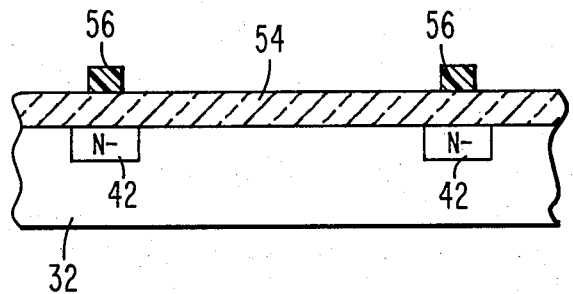
Figure 9:
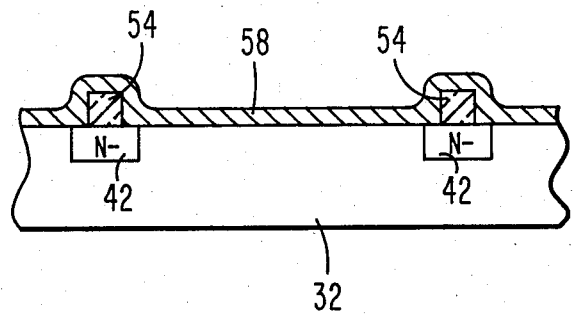
Figure 10:
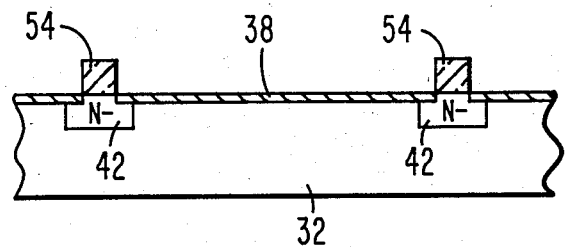

Referring to FIGS. 7-10, there is shown one method of forming the detector array 30. It should be understood that the method to be described starts with a substrate 32 having the parts of a CCD already formed therein along with the low resistivity coupling regions 40 of the detectors. The detector array 30 can be formed by first coating the top surface 34 of the substrate 32 with a layer 50 of a resist material and defining the resist layer 50 using standard photolithographic techniques to form openings 52 therethrough over the area of the surface 34 where the guard ring 42 is to be formed, as shown in FIG. 1. The guard ring 42 is then formed by embedding into the exposed area of the substrate N type conductivity modifiers, such as phosphorous, either by ion implantation or diffusion. The resist layer 50 is then removed and a masking layer 54, such as of silicon dioxide, is grown or deposited on the surface 34 as shown in FIG. 8. The masking layer 54 is coated with a resist layer which is defined using standard photolithographic techniques to form regions 56 over and extending along the guard ring 42 but narrower than the guard ring 42. The exposed portion of the masking layer 54 is then removed, such as by etching with buffered hydrofluoric acid, to leave a portion of the masking layer over and along the guard ring 42 which is narrower than the guard ring 42. The exposed portion of the surface 34 of the substrate 82 and the remaining portion of the masking layer 54 are then coated with a layer 58 of the metal to form the Schottky barrier, such as platinum or palladium. The device is then heated to a temperature of about 320° C. which will cause the metal layer 58 to react with the silicon substrate 32 and form the silicide detector areas 38 as shown in FIG. 10. Any excess metal can then be removed with a suitable etchant, such as aqua regia. The masking layer 54 can then be completely removed with a suitable etchant. The insulating layer 44 can then be deposited on the surface 34 of the substrate 32 and the reflecting layer 46 formed on the insulating layer 44 in the well-known manner.

Figure 11:
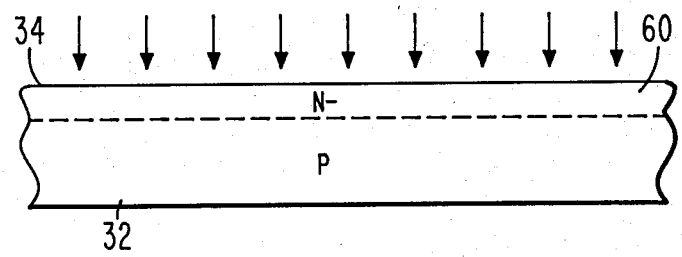
FIGS. 11-15 are sectional views illustrating the steps of another method for making the detector array of the present invention.
Figure 12:
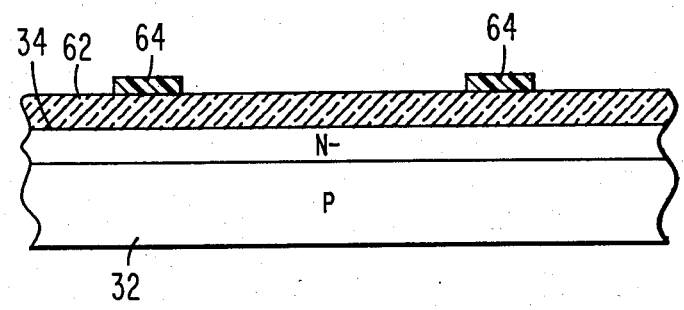
Figure 13:
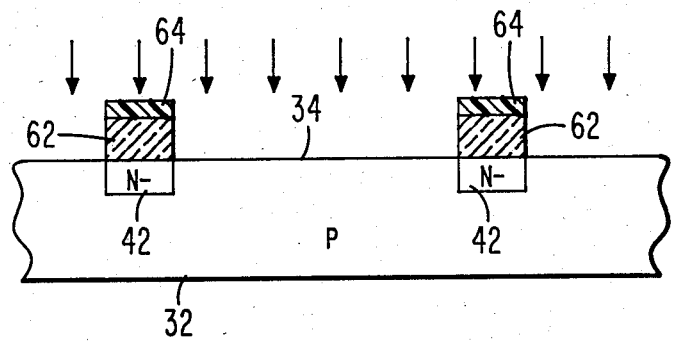

Another method of making the detector array 30 is shown in FIGS. 11-15. Again the method described starts with a substrate 32 having the parts of the CCD already formed therein. In this method, the detector array 30 is formed by first embedding into the top surface 34 of the substrate 32 a conductivity modifier of the type opposite to that of the substrate 32, such as by diffusion or ion implantation. For a P type substrate 32, arsenic or phosphorous ions may be embedded into the top surface 34 to form an N− layer 60 along the top surface 34 as shown in FIG. 11. A masking layer 62, such as of silicon dioxide, is then grown on or deposited on the top surface 34 of the substrate 32 as shown in FIG. 12. The formation of the masking layer 62 generally requires heating the substrate 32 which will diffuse the conductivity modifiers in the layer 60 deeper into the substrate 32 to a depth corresponding to the desired depth of the guard ring 42. Using standard photolithographic techniques, a layer 64 of a resist material is then formed on the masking layer 62 over the areas of the front surface 34 of the substrate 32 where the guard ring 42 is to be formed. The exposed portions of the masking layer 62 are then removed with a suitable etchant, such as buffered hydrofluoric acid, to expose the surface 34 of the substrate 32 as shown in FIG. 9. Conductivity modifiers of the same type as that of the substrate 32, such as boron ions for P type conductivity, are then embedded in the exposed portions of the top surface 34 as indicated by the arrows in FIG. 13. The P type ions compensate the N type ions in the exposed portions of the front surface 34 to convert these portions of the substrate back to P type, leaving the N type guard ring 42 in the substrate 32.

Figure 14:
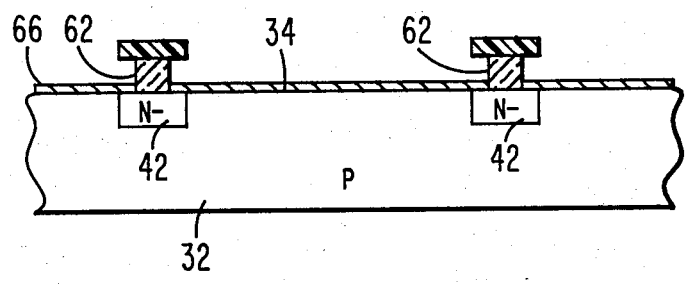
Figure 15:
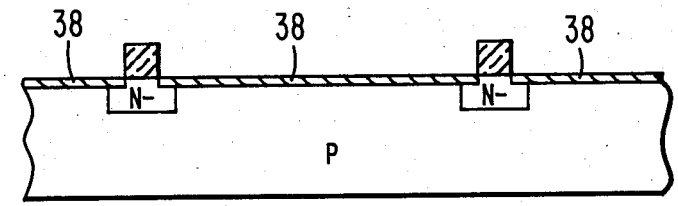

The remaining portions of the masking layer 62 are then subject to a suitable etchant to remove portions of the sides of the masking layer portions 62. This narrows the width of the masking layer portions 62 and exposes portions of the guard ring 42 as shown in FIG. 14. The masking layer portions 62 are narrowed to expose an amount of the guard ring 42 equal to the desired amount of overlap Z. The exposed portions of the surface 34 of the substrate 32 are then coated with a layer 66 of the metal for forming the silicide detector areas 38, such as palladium or platinum. The substrate 32 is then heated to a temperature of about 320° C. which will cause the metal layer 66 to react with the silicon substrate 32 and form the silicide detector areas 38 as shown in FIG. 15. Any excess metal can then be removed with a suitable etchant, such as aqua regia. The masking layer 62 can then be completely removed with a suitable etchant. The insulating layer 44 can then be deposited on the surface 34 of the substrate 32 and the reflecting layer 46 formed on the insulating layer 44 in the well-known manner.

This method of making the detector array 30 has the advantage over the first method described in that it is a self-aligned method which easily self aligns the detector areas 38 with the guard ring 42. Also, the overlap between the detector areas 38 and the guard ring 42 (the distance Z in FIG. 4) can be easily and accurately controlled since it is achieved by an etching operation which can be accurately controlled. However, it has the disadvantage that the Schottky-barrier between the silicide areas and the substrate 32 are made with compensated semiconductor material, i.e. semiconductor material containing both P and N type conductivity modifiers. Since the barrier height of the Schottky-barrier detectors tends to decrease with the increase of the doping of the silicon substrate, this compensation tends to limit the range of the useful barrier heights.

Figure 16:
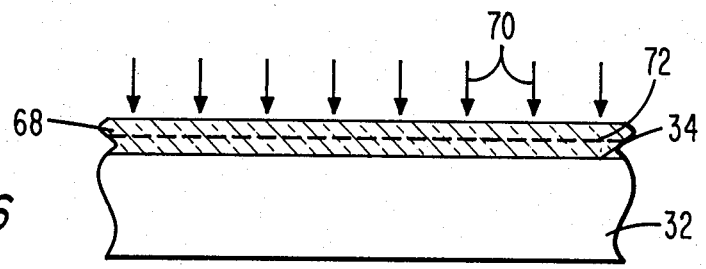
FIGS. 16-20 are sectional views illustrating the steps of a third method for making the detector array of the present invention.
Figure 17:
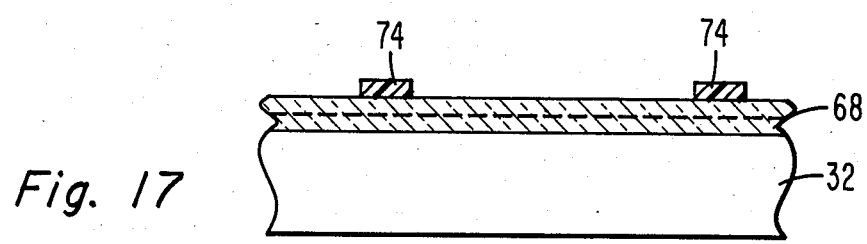
Figure 18:
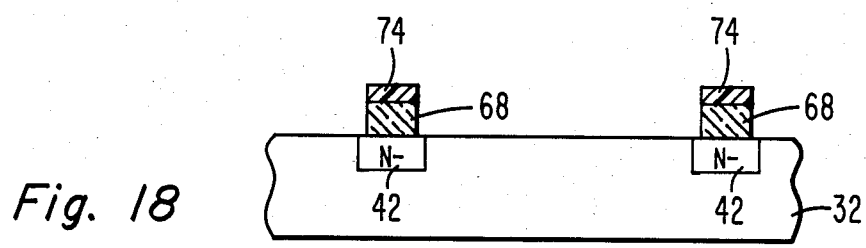
Figure 19:
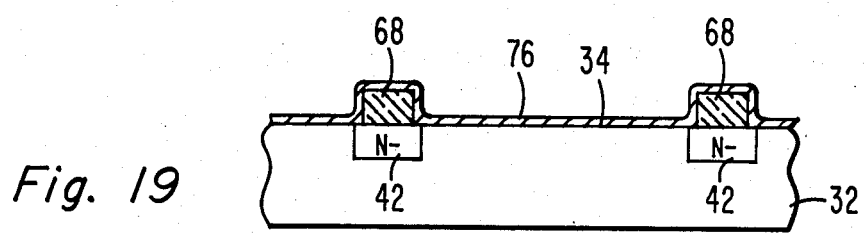
Figure 20:
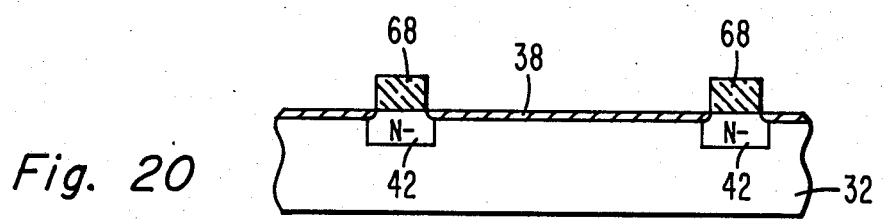

A third method of making the array 30 is illustrated in FIGS. 16-20. This method, like the methods previously described, starts with a substrate 32 having the parts of the CCD already formed therein. In this method a masking layer 68, such as of silicon dioxide, is grown or deposited on the top surface 34 of the substrate 32 as shown in FIG. 16. Ions of an N type conductivity modifier, such as arsenic, are then implanted into the masking layer 18 as shown by the arrows 70 in FIG. 16. The N— type ions are implanted only a part of the way into the masking layer 68 as indicated by the dash line 72 so that only the top portion of the masking layer 68 contains such ions and no N type ions are implanted into the silicon substrate. A layer 74 of a resist material is applied over the masking layer 68 and is defined by standard photolithographic techniques to form portions over the area of the substrate surface 34 where the guard band is to be formed as shown in FIG. 17. As shown in FIG. 18, the exposed portion of the masking layer 68 is then removed, such as by etching with buffered hydrofluoric acid. The device is then heated to drive the conductivity modifiers from the masking layer 68 onto the substrate 32 and form the guard band 42. During the diffusion of the conductivity modifier into the substrate 32 the ions not only diffuse down into the substrate but also diffuse slightly in a lateral direction along the surface 34 of the substrate 32. Thus, the resultant guard band 42 may be slightly wider than the portion of the masking layer 68 from which the ions are diffused. The masking layer is then subjected to a quick etch, such as with buffered HF, to slightly narrow the masking layer and expose the edges of the guard band 42. After removing the resist layer 74 from the masking layer 68, the exposed portion of the surface 34 of the substrate 32 and the masking layer 68 are coated with a layer 76 of the metal to form the Schottky-barrier. The device is then heated to a temperature of about 320° C. to cause the metal layer 76 to react with the silicon to form the silicide detector areas 38 as shown in FIG. 20. Any excess metal can be removed with a suitable etchant and the device is then completed in the manner previously described with regard to the other methods. This method has the advantages of being self-aligning and providing a Schottky-barrier with a semiconductor material which contains only a single type of conductivity modifier.

In the array 30 of the present invention, the guard ring 42 forms diodes with the portions of the substrate 32 directly under each of the silicide detector areas 38. Thus, in going from the portion of the substrate 32 under one detector area 38 across the guard ring 32 to the portion of the substrate under the next adjacent detector area 38, are two front-two-front diodes. Since one of these diodes is always reverse biased, the guard ring 42 will prevent the flow of electrons from one detector area 38 to an adjacent detector area. However, to prevent this undesired flow of electrons, the guard ring 42 must be spaced from the high conductivity contact regions 40 as shown in FIGS. 4 and 6. The major advantage of the array 30 is that it narrows the spacing between the detector areas 38 so that the detector is more compact. The spacing between the detector areas 38 (the Y distance in FIG. 4) can be as small as 3 to 5 micrometers as compared to 20 micrometers for the spacing between the detector areas 18 in the array 10 shown in FIGS. 1-3. Thus, there is provided by the present invention an IR detector array for a CCD imager which provides close spacing between the detector areas to achieve compactness of the array, yet provides for the necessary isolation between the detector areas. Although the Schottky-barriers in the detector areas have been described as being formed between a silicide layer and the silicon substrate, the silicide layer can be replaced with any suitable material which will form a Schottky-barrier with the silicon substrate.

We claim:
1. An array of infra-red detectors comprising
a substrate of single crystal silicon of one conductivity type,
a plurality of spaced apart detector areas of a conductive material at one surface of said substrate with each of said conductive areas forming a Schottky-barrier junction with said substrate,
each conductive area including a conductive coupling region of a conductivity type opposite to that of the substrate within the substrate under and in contact with a portion of the conductive material, and
means between adjacent detector areas isolating said areas from each other, said isolating means consisting of a region of a conductivity type opposite to that of the substrate in said substrate and extending along said one surface between said areas with each of said areas contacting said region, said region extending around the conductive areas and being spaced from the coupling regions.

2. An array in accordance with claim 1 in which each of the conductive areas overlaps a portion of the adjacent isolation region.

3. An array in accordance with claim 1 in which each of said conductive areas is a conductive silicide.

4. An array in accordance with claim 1 in which the periphery of each of the conductive areas overlaps a portion of the isolation region around said conductive area.

5. An array in accordance with claim 4 including a layer of an insulating material over said one surface of the substrate and a reflective metal layer on the insulating layer and over the detector areas.

6. An array in accordance with claim 1 in which the isolation region is a region containing a relatively low amount of conductivity modifier so as to be of relatively high resistance.

7. An array in accordance with claim 6 in which the substrate is of P type conductivity and the isolation region is of N− type conductivity.

* * * * *